(12) United States Patent
Shima et al.

(10) Patent No.: US 7,952,018 B2
(45) Date of Patent: May 31, 2011

(54) STACKED PHOTOVOLTAIC APPARATUS

(75) Inventors: Masaki Shima, Uji (JP); Machie Saitou, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 807 days.

(21) Appl. No.: 11/408,974

(22) Filed: Apr. 24, 2006

(65) Prior Publication Data
US 2006/0249197 A1 Nov. 9, 2006

(30) Foreign Application Priority Data

Apr. 26, 2005 (JP) ................................. 2005-127533

(51) Int. Cl.
H01L 31/00 (2006.01)
(52) U.S. Cl. ........ 136/255; 136/244; 136/256; 136/258; 136/261
(58) Field of Classification Search .................. 136/243, 136/255, 256, 258, 261
See application file for complete search history.

(56) References Cited

U.S. PATENT DOCUMENTS

| | | | | |
|---|---|---|---|---|
| 3,106,489 A | * | 10/1963 | Lepselter | 438/605 |
| 4,987,095 A | * | 1/1991 | Batey et al. | 438/393 |
| 2003/0111106 A1 | | 6/2003 | Nagano et al. | |

FOREIGN PATENT DOCUMENTS

| | | |
|---|---|---|
| EP | 1 478 030 A1 | 11/2004 |
| EP | 1478030 * | 11/2004 |
| JP | 05-102505 | 4/1993 |
| JP | 05-326993 | 12/1993 |
| JP | 2002-076396 A | 3/2002 |
| JP | 2002-222972 | 8/2002 |
| JP | 2003124481 A | 4/2003 |
| JP | 2003-142709 A | 5/2003 |
| JP | 2003-258279 * | 9/2003 |
| JP | 2003-298088 * | 10/2003 |

OTHER PUBLICATIONS

Japanese Office Action issued on Jan. 18, 2011 in the corresponding to Japanese Patent Application No.2005-127533.

* cited by examiner

*Primary Examiner* — Basia Ridley
*Assistant Examiner* — Thanh-Truc Trinh
(74) *Attorney, Agent, or Firm* — NDQ & M Watchstone LLP

(57) ABSTRACT

A stacked photovoltaic apparatus capable of improving the output characteristics is provided. This stacked photovoltaic apparatus comprises a second power generation unit including a second semiconductor layer having a first refractive index and a third semiconductor layer of an amorphous semiconductor functioning as a photoelectric conversion layer, an intermediate layer formed between a first power generation unit and the second power generation unit with a second refractive index and a reflection promotive layer formed between the intermediate layer and the second power generation unit with such a third refractive index that the difference between the third refractive index and the first refractive index is larger than the difference between the second refractive index and the first refractive index.

14 Claims, 3 Drawing Sheets

US 7,952,018 B2

STACKED PHOTOVOLTAIC APPARATUS

BACKGROUND OF THE INVENTION

1. Field of the Invention

The present invention relates to a stacked photovoltaic apparatus, and more particularly, it relates to a stacked photovoltaic apparatus including a plurality of power generation units.

2. Description of the Background Art

A stacked photovoltaic apparatus prepared by successively stacking a first power generation unit, an intermediate layer and a second power generation unit is known in general, as disclosed in Japanese Patent Laying-Open No. 2002-222972, for example. The aforementioned Japanese Patent Laying-Open No. 2002-222972 discloses a stacked photovoltaic apparatus comprising an intermediate layer of ZnO formed between a first power generation unit including a plurality of microcrystalline Si layers and a second power generation unit including a plurality of amorphous Si layers.

In the conventional stacked photovoltaic apparatus disclosed in the aforementioned Japanese Patent Laying-Open No. 2002-222972, the intermediate layer of ZnO is provided for reflecting light incident from the side of the second power generation unit to pass through the second power generation unit toward the side of the second power generation unit on the interface between the second power generation unit (amorphous Si layers) and the intermediate layer. In other words, the intermediate layer of ZnO in the aforementioned Japanese Patent Laying-Open No. 2002-222972 is provided for increasing the quantity of light incident upon the second power generation unit, thereby increasing the quantity of light photoelectrically converted in the second power generation unit.

In the conventional stacked photovoltaic apparatus disclosed in the aforementioned Japanese Patent Laying-Open No. 2002-222972, however, the difference (1.5) between the refractive index (2.0) of the ZnO layer constituting the intermediate layer and the refractive index (3.5) of the amorphous Si layers constituting the second power generation unit is so small that the quantity of light reflected on the interface between the intermediate layer and the second power generation unit is disadvantageously small despite the intermediate layer of ZnO. In the conventional stacked photovoltaic apparatus disclosed in the aforementioned Japanese Patent Laying-Open No. 2002-222972, therefore, the rate of increase of the light photoelectrically converted in the second power generation unit is so small that it is difficult to increase the quantity of short-circuit current despite the intermediate layer of ZnO. Consequently, it is difficult to improve the output characteristics of the stacked photovoltaic apparatus.

SUMMARY OF THE INVENTION

The present invention has been proposed in order to solve the aforementioned problem, and an object of the present invention is to provide a stacked photovoltaic apparatus capable of improving the output characteristics.

In order to attain the aforementioned object, a photovoltaic apparatus according to an aspect of the present invention comprises a first power generation unit including a first semiconductor layer functioning as a photoelectric conversion layer, a second power generation unit including a first conductive type second semiconductor layer formed on the first power generation unit with a first refractive index, a third semiconductor layer of a substantially intrinsic amorphous semiconductor formed on the second semiconductor layer for functioning as another photoelectric conversion layer and a second conductive type fourth semiconductor layer formed on the third semiconductor layer, an intermediate layer formed between the first power generation unit and the second power generation unit with a second refractive index and a reflection promotive layer formed between the intermediate layer and the second semiconductor layer of the second power generation unit with such a third refractive index that the difference between the third refractive index and the first refractive index of the second semiconductor layer is larger than the difference between the second refractive index of the intermediate layer and the first refractive index of the second semiconductor layer.

In the stacked photovoltaic apparatus according to this aspect, as hereinabove described, the reflection promotive layer having such a third refractive index that the difference between the third refractive index and the first refractive index of the second semiconductor layer is larger than the difference between the second refractive index of the intermediate layer and the first refractive index of the second semiconductor layer is so formed between the intermediate layer and the second semiconductor layer of the second power generation unit that the reflectance on the interface between the reflection promotive layer and the second semiconductor layer of the second power generation unit is higher than that on the interface between the intermediate layer and the second semiconductor layer holding no reflection promotive layer therebetween with respect to light incident from the side of the second power generation unit, whereby the quantity of light reflected toward the side of the second power generation unit can be increased as compared with the case of forming no reflection promotive layer between the intermediate layer and the second semiconductor layer. Thus, the quantity of light incident upon the third semiconductor layer of the second power generation unit functioning as the photoelectric conversion layer from the side of the second power generation unit can be so increased as to increase the quantity of light photoelectrically converted in the third semiconductor layer (photoelectric conversion layer) of the second power generation unit. Consequently, the quantity of short-circuit current can be so increased as to improve the output characteristics of the stacked photovoltaic apparatus. Further, the quantity of light incident upon the third semiconductor layer (photoelectric conversion layer) of the second power generation unit can be increased due to the reflection promotive layer formed between the intermediate layer and the second semiconductor layer of the second power generation unit, whereby the quantity of light photoelectrically converted in the third semiconductor layer (photoelectric conversion layer) is not reduced due to a small optical path length in the third semiconductor layer (photoelectric conversion layer) having a small thickness. Thus, the thickness of an amorphous Si layer, more easily photo-deteriorated than a microcrystalline Si layer, employed as the third semiconductor layer (photoelectric conversion layer) of the second power generation unit can be so reduced as to suppress photo-deterioration of the amorphous Si layer functioning as the photoelectric conversion layer resulting from a large thickness. Therefore, the rate of photo-deterioration of the output characteristics of the stacked photovoltaic apparatus including the second power generation unit having the photoelectric conversion layer formed by the amorphous Si layer can be inhibited from increase.

In the stacked photovoltaic apparatus according to the aforementioned aspect, the second refractive index of the intermediate layer is preferably smaller than the first refractive index of the second semiconductor layer, and the third refractive index of the reflection promotive layer is preferably smaller than the second refractive index of the intermediate layer. According to this structure, the difference between the third refractive index of the reflection promotive layer and the first refractive index of the second semiconductor layer can be easily rendered larger than the difference between the second refractive index of the intermediate layer and the first refractive index of the second semiconductor layer.

In the stacked photovoltaic apparatus according to the aforementioned aspect, the intermediate layer is preferably formed by a conductive layer, and the reflection promotive layer is preferably formed by an insulator layer with a smaller thickness than the intermediate layer. According to this structure, the insulator layer (reflection promotive layer) formed between the intermediate layer and the second semiconductor layer of the second power generation unit with the small thickness can suppress disadvantageous increase of electric resistance between the intermediate layer and the second semiconductor layer.

In the stacked photovoltaic apparatus according to the aforementioned aspect, the intermediate layer preferably includes a metal oxide layer, and the metal oxide layer constituting the intermediate layer preferably includes a first portion having a first oxygen concentration and a second portion, positioned closer to the reflection promotive layer, having a second oxygen concentration lower than the first oxygen concentration of the first portion. According to this structure, the conductivity of the second portion of the intermediate layer having the low second oxygen concentration can be so increased as to increase the total conductivity of the intermediate layer. Thus, series resistance can be inhibited from increase in the stacked photovoltaic apparatus having the first and second power generation units serially connected with each other through the intermediate layer. Consequently, the fill factor of the stacked photovoltaic apparatus can be so inhibited from reduction that conversion efficiency can be improved.

In this case, the reflection promotive layer preferably includes an oxygen-containing layer, and is preferably formed on the second portion of the metal oxide layer constituting the intermediate layer. According to this structure, oxygen escapes from a portion (second portion) around the surface of the intermediate layer (metal oxide layer) closer to the reflection promotive layer and moves toward the reflection promotive layer when the oxygen-containing layer functioning as the reflection promotive layer is formed on the intermediate layer (metal oxide layer) by plasma CVD, for example, whereby the second oxygen concentration of the second portion of the metal oxide layer constituting the intermediate layer can be easily lowered.

In the stacked photovoltaic apparatus according to the aforementioned aspect, the reflection promotive layer preferably consists of an oxide of an element constituting the second semiconductor layer of the second power generation unit. According to this structure, the reflection promotive layer is constituted of $SiO_2$ having a refractive index of 1.5 when Si having a refractive index of 3.5 is employed as the material for the second semiconductor layer, whereby the difference between the refractive indices of the second semiconductor layer and the reflection promotive layer can be easily increased.

In this case, the element constituting the second semiconductor layer of the second power generation unit is preferably Si. According to this structure, the second semiconductor layer is constituted of Si (refractive index: 3.5) and the reflection promotive layer is constituted of $SiO_2$ (refractive index: 1.5), whereby the difference between the refractive indices of the second semiconductor layer and the reflection promotive layer can be more easily increased.

In the stacked photovoltaic apparatus according to the aforementioned aspect, the second semiconductor layer preferably includes an Si layer, the intermediate layer preferably includes a ZnO layer, and the reflection promotive layer preferably includes an $SiO_2$ layer. According to this structure, the difference (3.5−1.5=2) between the first refractive index (3.5) of the second semiconductor layer and the third refractive index (1.5) of the reflection promotive layer can be easily rendered larger than the difference (3.5−2.0=1.5) between the first refractive index (3.5) of the second semiconductor layer and the second refractive index (2.0) of the intermediate layer since the refractive indices of the Si layer (second semiconductor layer), the ZnO layer (intermediate layer) and the $SiO_2$ layer (reflection promotive layer) are 3.5, 2.0 and 1.5 respectively.

In the stacked photovoltaic apparatus according to the aforementioned aspect, the first semiconductor layer of the first power generation unit functioning as the photoelectric conversion layer preferably includes a microcrystalline semiconductor layer, and the second power generation unit including the second semiconductor layer of the amorphous semiconductor functioning as the photoelectric conversion layer is preferably arranged on a light incidence side. According to this structure, the output characteristics can be easily improved in the stacked photovoltaic apparatus formed by stacking the first power generation unit including the microcrystalline semiconductor layer functioning as the photoelectric conversion layer and the second power generation unit including the amorphous semiconductor layer functioning as the photoelectric conversion layer with each other while arranging the second power generation unit on the light incidence side.

In the stacked photovoltaic apparatus according to the aforementioned aspect, the third semiconductor layer of the second power generation unit functioning as the photoelectric conversion layer preferably photoelectrically converts light incident from the side of the second power generation unit and light reflected toward the side of the third semiconductor layer on the interface between the second semiconductor layer of the second power generation unit and the reflection promotive layer. According to this structure, the quantity of light photoelectrically converted in the third semiconductor layer (photoelectric conversion layer) of the second power generation unit can be easily increased.

In this case, the photoelectric conversion layer of the first power generation unit preferably photoelectrically converts light incident from the side of the second power generation unit and transmitted through the reflection promotive layer. According to this structure, the light incident from the side of the second power generation unit can be easily photoelectrically converted in the photoelectric conversion layer of the first power generation unit.

In the stacked photovoltaic apparatus according to the aforementioned aspect, the reflection promotive layer preferably has a corrugated surface. According to this structure, the degree of light scattering on the interface between the second semiconductor layer of the second power generation unit and the reflection promotive layer is so increased as to further increase the path length of the light reflected toward the side of the photoelectric conversion layer (third semiconductor layer) of the second power generation unit.

In this case, the second semiconductor layer of the second power generation unit is preferably formed on the corrugated surface of the reflection promotive layer. According to this structure, the surface of the second semiconductor layer can be corrugated by reflecting the corrugated surface of the reflection promotive layer, whereby light can be scattered through the corrugated surface of the second semiconductor layer. Thus, a light confinement effect can be improved in the second power generation unit.

In the stacked photovoltaic apparatus according to the aforementioned aspect, the photoelectric conversion layer of at least either the first power generation unit or the second power generation unit preferably has a corrugated surface. According to this structure, light can be scattered through the corrugated surface of at least either the first power generation unit or the second power generation unit, whereby a light confinement effect can be improved in at least either the first power generation unit or the second power generation unit.

The stacked photovoltaic apparatus according to the aforementioned aspect preferably further comprises a substrate transmitting no light, and the first power generation unit, the intermediate layer, the reflection promotive layer and the second power generation unit are preferably successively stacked on the substrate. According to this structure, light photoelectrically converted in the second power generation unit is incident from the side of the second power generation unit, whereby the incident light can be easily reflected toward the third semiconductor layer (photoelectric conversion layer) of the second power generation unit on the interface between the second semiconductor layer of the second power generation unit and the reflection promotive layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Examples of the present invention are now specifically described.

EXAMPLE 1

First, the structure of a stacked photovoltaic apparatus prepared according to Example 1 of the present invention is described with reference to FIG. 1.

Figure 1:
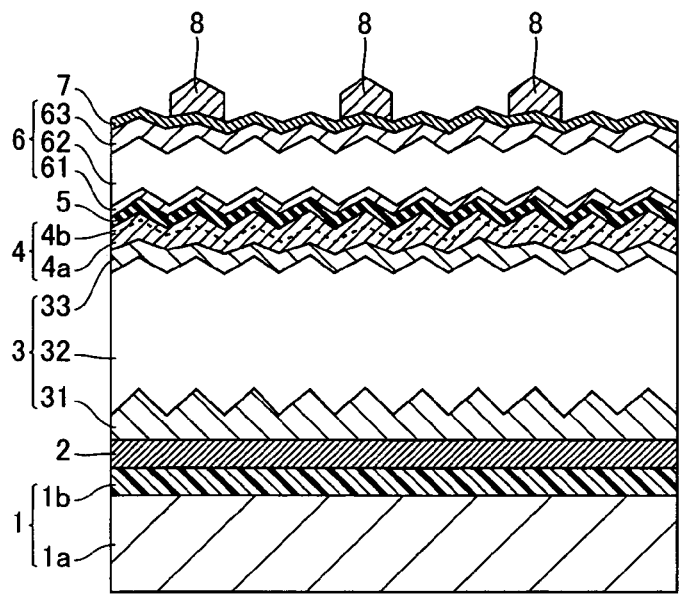
FIG. 1 is a sectional view showing the structure of a stacked photovoltaic apparatus prepared according to Example 1 of the present invention.

In the stacked photovoltaic apparatus according to Example 1, a resin layer 1b of polyimide resin having a thickness of 20 µm is formed on a planar stainless steel sheet (SUS430) 1a having a thickness of 0.15 mm, as shown in FIG. 1. The stainless steel sheet 1a and the resin layer 1b constitute a substrate 1 having a planar surface. A planar back electrode 2 of Ag having a thickness of 200 nm is formed on the substrate 1 (resin layer 1b).

The stacked photovoltaic apparatus according to Example 1 is formed by a microcrystalline Si-based power generation unit 3 and an amorphous Si-based power generation unit 6 stacked with each other, while the amorphous Si-based power generation unit 6 is arranged on a light incidence side. The microcrystalline Si-based power generation unit 3 is an example of the "first power generation unit" in the present invention, and the amorphous Si-based power generation unit 6 is an example of the "second power generation unit" in the present invention.

More specifically, an n-type layer 31 of n-type microcrystalline Si, a photoelectric conversion layer 32 of non-doped microcrystalline Si and a p-type layer 33 of p-type microcrystalline Si are successively formed on the back electrode 2. The n-type layer 31, the photoelectric conversion layer 32 and the p-type layer 33 have thicknesses of 80 nm, 2 µm and 20 nm respectively. The photoelectric conversion layer 32 is an example of the "first semiconductor layer" in the present invention. The n-type layer 31, the photoelectric conversion layer 32 and the p-type layer 33 constitute the microcrystalline Si-based power generation unit 3.

According to Example 1, a ZnO layer 4, having a thickness of 20 nm, doped with 2% of Al is formed on the microcrystalline Si-based power generation unit 3 (p-type layer 33) as an intermediate layer. The ZnO layer 4 has different oxygen concentrations in an area 4a closer to the microcrystalline Si-based power generation unit 3 and another area (closer to the amorphous Si-based power generation unit 6) 4b around the surface thereof. In other words, the area 4b of the ZnO layer 4 around the surface thereof has a lower oxygen concentration than the remaining area 4a of the ZnO layer 4. Further, the ZnO layer 4 has a refractive index of 2.0, which is smaller than the refractive index (3.5) of an n-type layer 61 of the amorphous Si-based power generation unit 6 described later. The ZnO layer 4 is an example of the "intermediate layer", the "conductive layer" or the "metal oxide layer" in the present invention. The areas 4a and 4b are examples of the "first portion" and the "second portion" in the present invention respectively.

According to Example 1, an $SiO_2$ film 5 having a thickness of 10 nm, which is smaller than the thickness (20 nm) of the ZnO layer 4, is formed on the ZnO layer 4. This $SiO_2$ film 5 has a refractive index of 1.5, which is smaller than the refractive index (2.0) of the ZnO layer 4. In other words, the difference (2.0) between the refractive index (1.5) of the $SiO_2$ film 5 and the refractive index (3.5) of the n-type layer 61 of the amorphous Si-based power generation unit 6 is larger than the difference (1.5) between the refractive index (2.0) of the ZnO layer 4 and the refractive index (3.5) of the n-type layer 61 of the amorphous Si-based power generation unit 6. The $SiO_2$ film 5 is an example of the "reflection promotive layer" or the "insulator layer" in the present invention.

The n-type layer 61 of n-type amorphous Si, a photoelectric conversion layer 62 of non-doped amorphous Si and a p-type layer 63 of p-type amorphous Si are successively formed on the $SiO_2$ film 5. The n-type layer 61, the photoelectric conversion layer 62 and the p-type layer 63 have thicknesses of 20 nm, 350 nm and 15 nm respectively. The Si layers constituting the n-type layer 61, the photoelectric conversion layer 62 and the p-type layer 63 respectively have refractive indices of 3.5. The n-type layer 61, the photoelectric conversion layer 62 and the p-type layer 63 are examples of the "second semiconductor layer", the "third semiconductor layer" and the "fourth semiconductor layer" in the present invention respectively. The n-type layer 61, the photoelectric conversion layer 62 and the p-type layer 63 constitute the amorphous Si-based power generation unit 6.

A surface transparent electrode 7 of ITO (indium tin oxide) having a thickness of 80 nm is formed on the amorphous Si-based power generation unit 6 (p-type layer 63). Collectors 8 of Ag having a thickness of 2 μm are formed on prescribed regions of the surface transparent electrode 7.

[Preparation of Stacked Photovoltaic Apparatus]

The process employed for preparing the stacked photovoltaic apparatus according to Example 1 in practice is now described.

First, the substrate 1 constituted of the stainless steel sheet 1a and the resin layer 1b was prepared by vapor-depositing/polymerizing the resin layer 1b of polyimide resin having the thickness of 20 μm on the planar stainless steel sheet 1a having the thickness of 0.15 mm, as shown in FIG. 1. Thereafter the planar back electrode 2 of Ag having the thickness of 200 nm was formed on the substrate 1 (resin layer 1b) by RF magnetron sputtering.

Then, the three Si layers constituting the microcrystalline Si-based power generation unit 3 were successively formed on the back electrode 2 by plasma CVD (chemical vapor deposition). More specifically, the n-type layer 31 of n-type microcrystalline Si, the photoelectric conversion layer 32 of non-doped microcrystalline Si and the p-type layer 33 of p-type microcrystalline Si were successively formed. At this time, the n-type layer 31, the photoelectric conversion layer 32 and the p-type layer 33 were formed with the thicknesses of 80 nm, 2 μm and 20 nm respectively. Table 1 shows the conditions employed for forming the n-type layer 31, the photoelectric conversion layer 32 and the p-type layer 33 respectively.

TABLE 1

| | | Substrate Temperature (° C.) | Reaction Pressure (Pa) | High-Frequency Power (W) | Gas Flow Rate (sccm) |
|---|---|---|---|---|---|
| Microcrystalline Si-Based Power Generation Unit | n-Type Layer | 160 | 26 | 100 | $SiH_4$: 3<br>$H_2$: 200<br>$PH_3$: 3 |
| | Photoelectric Conversion Layer | 200 | 133 | 30 | $SiH_4$: 20<br>$H_2$: 400 |
| | p-Type Layer | 120 | 133 | 50 | $SiH_4$: 1<br>$H_2$: 400<br>$B_2H_6$: 1 |

Referring to Table 1, the substrate temperature, the reaction pressure and the high-frequency power for forming the n-type layer 31 of n-type microcrystalline Si were set to 160° C., 26 Pa and 100 W respectively. Further, the gas flow rates of $SiH_4$ gas, $H_2$ gas and $PH_3$ gas for forming the n-type layer 31 were set to 3 sccm, 200 sccm and 3 sccm respectively. $H_2$-based $PH_3$ gas containing 2% of $PH_3$ was employed as the $PH_3$ gas.

The substrate temperature, the reaction pressure and the high-frequency power for forming the photoelectric conversion layer 32 of non-doped microcrystalline Si were set to 200° C., 133 Pa and 30 W respectively. Further, the gas flow rates of $SiH_4$ gas and $H_2$ gas for forming the photoelectric conversion layer 32 were set to 20 sccm and 400 sccm respectively.

The substrate temperature, the reaction pressure and the high-frequency power for forming the p-type layer 33 of p-type microcrystalline Si were set to 120° C., 133 Pa and 50 W respectively. Further, the gas flow rates of $SiH_4$ gas, $H_2$ gas and $B_2H_6$ gas for forming the p-type layer 33 were set to 1 sccm, 400 sccm and 1 sccm respectively. $H_2$-based $B_2H_6$ gas containing 1% of $B_2H_6$ was employed as the $B_2H_6$ gas.

Then, the ZnO layer 4 having the refractive index of 2.0 was formed on the microcrystalline Si-based power generation unit 3 (p-type layer 33) as the intermediate layer by RF magnetron sputtering. At this time, the ZnO layer 4 was formed with the thickness of 20 nm. Table 2 shows conditions employed for forming the ZnO layer 4.

TABLE 2

| | Substrate Temperature (° C.) | Reaction Pressure (Pa) | High-Frequency Power (W) | Gas Flow Rate (sccm) |
|---|---|---|---|---|
| ZnO Layer (Intermediate Layer) | 100 | 50 | 280 | Ar: 10 |

Referring to Table 2, the substrate temperature, the reaction pressure and the high-frequency power for forming the ZnO layer 4 were set to 100° C., 50 Pa and 280 W respectively. Further, the gas flow rate of Ar gas for forming the ZnO layer 4 was set to 10 sccm.

Then, the $SiO_2$ film 5 having the refractive index of 1.5 was formed on the ZnO layer 4 as the reflection promotive layer by plasma CVD. At this time, the $SiO_2$ film 5 was formed with the thickness of 10 nm. Table 3 shows conditions employed for forming the $SiO_2$ film 5.

TABLE 3

| | Substrate Temperature (° C.) | Reaction Pressure (Pa) | High-Frequency Power (W) | Gas Flow Rate (sccm) |
|---|---|---|---|---|
| $SiO_2$ Film (Reflection Promotive Layer) | 180 | 50 | 30 | $SiH_4$: 80<br>$H_2$: 160<br>$CO_2$: 0.8 |

Referring to Table 3, the substrate temperature, the reaction pressure and the high-frequency power for forming the $SiO_2$ film 5 were set to 180° C., 50 Pa and 30 W respectively. Further, the gas flow rates of $SiH_4$ gas, $H_2$ gas and $CO_2$ gas for forming the $SiO_2$ film 5 were set to 80 sccm, 160 sccm and 0.8 sccm respectively.

Then, the three Si layers constituting the amorphous Si-based power generation unit 6 with the refractive indices of 3.5 were successively formed on the $SiO_2$ film 5 by plasma CVD. More specifically, the n-type layer 61 of n-type amorphous Si, the photoelectric conversion layer 62 of non-doped amorphous Si and the p-type layer 63 of p-type amorphous Si were successively formed. At this time, the n-type layer 61, the photoelectric conversion layer 62 and the p-type layer 63 were formed with the thicknesses of 20 nm, 350 nm and 15 nm respectively. Table 4 shows conditions employed for forming the n-type layer 61, the photoelectric conversion layer 62 and the p-type layer 63 respectively.

TABLE 4

| | | Substrate Temperature (° C.) | Reaction Pressure (Pa) | High-Frequency Power (W) | Gas Flow Rate (sccm) |
|---|---|---|---|---|---|
| Amorphous Si-Based Power Generation | n-Type Layer | 180 | 50 | 30 | $SiH_4$: 80<br>$H_2$: 160<br>$PH_3$: 80 |
| | Photoelectric | 180 | 130 | 30 | $SiH_4$: 300 |

TABLE 4-continued

|  |  | Substrate Temperature (° C.) | Reaction Pressure (Pa) | High-Frequency Power (W) | Gas Flow Rate (sccm) |
|---|---|---|---|---|---|
| Unit | Conversion Layer |  |  |  | H$_2$: 1000 |
|  | p-Type Layer | 90 | 80 | 30 | SiH$_4$: 40<br>H$_2$: 800<br>B$_2$H$_6$: 12 |

Referring to Table 4, the substrate temperature, the reaction pressure and the high-frequency power for forming the n-type layer 61 of n-type microcrystalline Si were set to 180° C., 50 Pa and 30 W respectively. Further, the gas flow rates of SiH$_4$ gas, H$_2$ gas and PH$_3$ gas for forming the n-type layer 61 were set to 80 sccm, 160 sccm and 80 sccm respectively. H$_2$-based PH$_3$ gas containing 2% of PH$_3$ was employed as the PH$_3$ gas.

The substrate temperature, the reaction pressure and the high-frequency power for forming the photoelectric conversion layer 62 of non-doped microcrystalline Si were set to 180° C., 130 Pa and 30 W respectively. Further, the gas flow rates of SiH$_4$ gas and H$_2$ gas for forming the photoelectric conversion layer 62 were set to 300 sccm and 1000 sccm respectively.

The substrate temperature, the reaction pressure and the high-frequency power for forming the p-type layer 63 of p-type amorphous Si were set to 90° C., 80 Pa and 30 W respectively. Further, the gas flow rates of SiH$_4$ gas, H$_2$ gas and B$_2$H$_6$ gas for forming the p-type layer 63 were set to 40 sccm, 800 sccm and 12 sccm respectively. H$_2$-based B$_2$H$_6$ gas containing 1% of B$_2$H$_6$ was employed as the B$_2$H$_6$ gas.

Then, the surface transparent electrode 7 of ITO having the thickness of 80 nm was formed on the amorphous Si-based power generation unit 6 (p-type layer 63) by RF magnetron sputtering. Thereafter the collectors 8 of Ag having the thickness of 2 μm were formed on the prescribed regions of the surface transparent electrode 7 by vacuum evaporation, thereby preparing the stacked photovoltaic apparatus according to Example 1.

Results of measurement performed for confirming the presence of the SiO$_2$ film 5 on the stacked photovoltaic apparatus according to Example 1 prepared in the aforementioned manner are now described with reference to FIG. 2. The measurement for confirming the presence of the SiO$_2$ film 5 was performed according to ESCA (electron spectroscopy for chemical analysis), which is a method of acquiring information related to an objective substance by applying X-rays to the surface of the objective substance and measuring the energy of electrons jumping out of the surface due to a photoelectric effect. ESCA measurement conditions were set as follows:

applied X-rays: MgK$_\alpha$
sputtering ion species: Ar$^+$
accelerating voltage: 4 kV
angle of incidence: 45°
analyzed area: 400 μm in diameter
angle of detection: 45°

Figure 2:
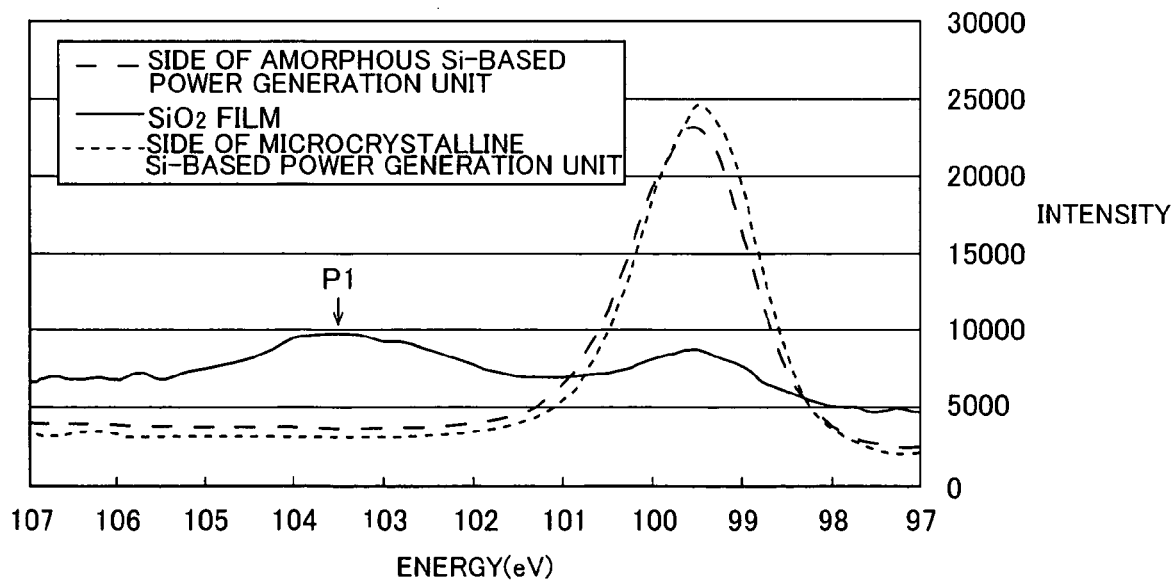
FIGS. 2 and 3 are graphs showing results of measurement of the stacked photovoltaic apparatus according to Example 1 of the present invention through X-ray photoelectron spectroscopy.

Referring to FIG. 2, it can be said that SiO$_2$ is present if the energy (axis of abscissas) is 103.5 eV when the intensity (axis of ordinates) reaches the peak.

The stacked photovoltaic apparatus according to Example 1 exhibited the energy of 103.5 eV when the intensity on the area corresponding to the SiO$_2$ film 5 reached the peak (P1 in FIG. 2) as shown in FIG. 2, whereby it has been confirmable that the SiO$_2$ film 5 was present between the microcrystalline Si-based power generation unit 3 and the amorphous Si-based power generation unit 6.

Figure 3:
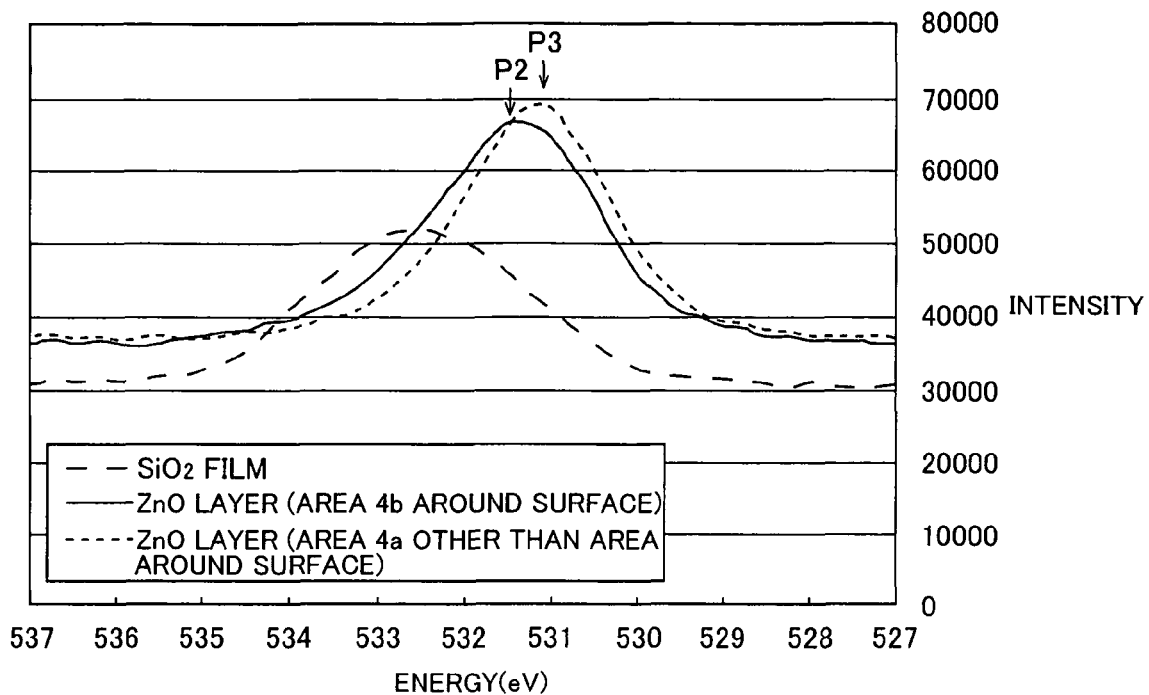

Results of measurement on the quantities of O (oxygen) in regions corresponding to the areas 4a and 4b of the ZnO layer 4 and the SiO$_2$ film 5 respectively are described with reference to FIG. 3. This measurement of the quantities of O (oxygen) was also performed according to ESCA. It can be said that the quantity of O (oxygen) is increased in inverse proportion to the energy (axis of abscissas) observed when the intensity (axis of ordinates) reaches the peak in FIG. 3.

In the stacked photovoltaic apparatus according to Example 1, the energy observed when the intensity on the area 4b of the ZnO layer 4 around the surface thereof reached the peak (P2 in FIG. 3) is smaller than that observed when the intensity on the remaining area 4a of the ZnO layer 4 reached the peak (P3 in FIG. 3), whereby it has been proved that the oxygen concentration in the area 4b of the ZnO layer 4 around the surface thereof was lower than the oxygen concentration in the remaining area 4a of the ZnO layer 4. This is conceivably because O (oxygen) having been present in the area 4b of the ZnO layer 4 around the surface thereof escaped and moved toward the SiO$_2$ film 5 when the SiO$_2$ film 5 was formed on the ZnO layer 4 by plasma CVD.

COMPARATIVE EXAMPLE

A process employed for preparing a stacked photovoltaic apparatus according to comparative example with respect to the aforementioned Example 1 is now described.

[Preparation of Stacked Photovoltaic Apparatus]

Figure 4:
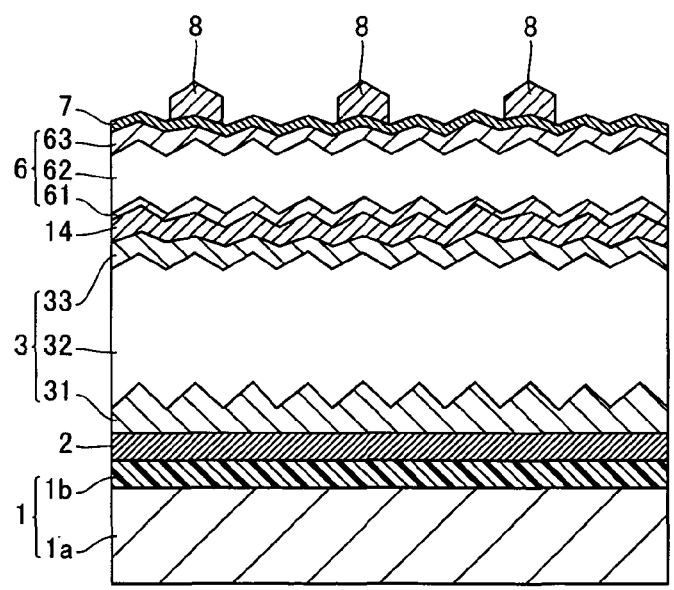
FIG. 4 is a sectional view showing the structure of a stacked photovoltaic apparatus prepared according to Comparative Example.

As shown in FIG. 4, a substrate 1 was prepared by vapor-depositing/polymerizing a resin layer 1b of polyimide resin having a thickness of 20 μm on a stainless steel sheet 1a having a thickness of 0.15 mm, similarly to the aforementioned Example 1. Thereafter a back electrode 2 of Ag having a thickness of 200 nm was formed on the substrate 1 by RF magnetron sputtering.

Then, a microcrystalline Si-based power generation unit 3 consisting of three Si layers was formed on the back electrode 2 by plasma CVD, similarly to the aforementioned Example 1. In other word, an n-type layer 31 of n-type microcrystalline Si, a photoelectric conversion layer 32 of non-doped microcrystalline Si and a p-type layer 33 of p-type microcrystalline Si were successively formed on the back electrode 2. At this time, the n-type layer 31, the photoelectric conversion layer 32 and the p-type layer 33 were formed with thicknesses of 80 nm, 2 μm and 20 nm respectively. Further, the n-type layer 31, the photoelectric conversion layer 32 and the p-type layer 33 were formed under the same conditions as those shown in Table 1.

Then, a ZnO layer 14 having a refractive index of 2.0 was formed on the microcrystalline Si-based power generation unit 3 (p-type layer 33) as an intermediate layer by RF magnetron sputtering. At this time, the ZnO layer 14 was formed with a thickness of 20 nm, under the same conditions as those shown in Table 2. According to comparative example, no SiO$_2$ film was formed on the ZnO layer 14, dissimilarly to the aforementioned Example 1. Therefore, the ZnO layer 14 according to comparative example exhibited a higher oxygen concentration than the ZnO layer 4 according to the aforementioned Example 1 since no O (oxygen) escaped from the ZnO layer 14.

Then, an amorphous Si-based power generation unit 6, having a refractive index of 3.5, consisting of three Si layers was formed on the ZnO layer 14 by plasma CVD, similarly to the aforementioned Example 1. In other words, an n-type layer 61 of n-type amorphous Si, a photoelectric conversion layer 62 of non-doped amorphous Si and a p-type layer 63 of p-type amorphous Si were successively formed on the ZnO layer 14. At this time, the n-type layer 61, the photoelectric conversion layer 62 and the p-type layer 63 were formed with thicknesses of 20 nm, 350 nm and 15 nm respectively, under the same conditions as those shown in Table 4.

Then, a surface transparent electrode 7 of ITO having a thickness of 80 nm was formed on the amorphous Si-based power generation unit 6 (p-type layer 63) by RF magnetron sputtering, similarly to the aforementioned Example 1. Further, collectors 8 of Ag having a thickness of 2 μm were formed on prescribed regions of the surface transparent electrode 7 by vacuum evaporation. The stacked photovoltaic apparatus according to comparative example was prepared in this manner. In the stacked photovoltaic apparatus according to comparative example, light is incident from the side of the amorphous Si-based power generation unit 6, similarly to the aforementioned Example 1.

COMMON TO EXAMPLE 1 AND COMPARATIVE EXAMPLE

[Output Characteristic Experiment]

Then, the output characteristics of the stacked photovoltaic apparatuses according to Example 1 and comparative example prepared in the aforementioned manner were measured under the following pseudo-sunlight photoirradiation conditions:

optical spectrum: AM 1.5
light intensity: 100 mW/cm$^2$
measuring temperature: 25° C.

The abbreviation AM (air mass) stands for the ratio of a path of direct sunlight incident upon the earth's atmosphere to a path of sunlight perpendicularly incident upon the standard atmosphere (standard pressure: 1013 hPa). Table 5 shows results of this measurement. Referring to Table 5, the values of the normalized conversion efficiency, the normalized open-circuit voltage, the normalized short-circuit current and the normalized fill factor of Example 1 are normalized with reference to the normalized conversion efficiency, the normalized open-circuit voltage, the normalized short-circuit current and the normalized fill factor of comparative example respectively.

TABLE 5

| | Normalized Conversion Efficiency | Normalized Open-Circuit Voltage | Normalized Short-Circuit Current | Normalized Fill Factor |
|---|---|---|---|---|
| Example 1 | 1.04 | 0.99 | 1.03 | 1.02 |
| Comparative Example | 1.00 | 1.00 | 1.00 | 1.00 |

Referring to Table 5, it has been proved that the stacked photovoltaic apparatus according to Example 1 formed with the SiO$_2$ film 5 (refractive index: 1.5) between the ZnO layer 4 (refractive index: 2.0) functioning as the intermediate layer and the n-type layer 61 (refractive index: 3.5) of the amorphous Si-based power generation unit 6 formed on the microcrystalline Si-based power generation unit 3 through the intermediate layer exhibited larger short-circuit current than comparative example formed with no SiO$_2$ film between the ZnO layer 14 (refractive index: 2.0) functioning as the intermediate layer and the n-type layer 61 (refractive index: 3.5). More specifically, the normalized short-circuit current of Example 1 was 1.03.

It is conceivable from this result that the quantity of light reflected toward the side of the amorphous Si-based power generation unit 6 was larger in Example 1 having the difference of 2.0 between the refractive indices of the n-type layer 61 and the SiO$_2$ film 5 as compared with comparative example having the difference of 1.5 between the refractive indices of the n-type layer 61 and the ZnO layer 14. Thus, the quantity of light photoelectrically converted in the photoelectric conversion layer 62 was conceivably more increased in Example 1 as compared with comparative example, due to the large quantity of light incident upon the amorphous Si-based power generation unit 6.

Referring to Table 5, it has also been proved that the fill factor and the conversion efficiency were more improved in the stacked photovoltaic apparatus according to Example 1 having the amorphous Si-based power generation unit 6 provided on the microcrystalline Si-based power generation unit 3 through the intermediate layer formed by the ZnO layer 4 including the area 4b, having the low oxygen concentration, around the surface thereof as compared with the stacked photovoltaic apparatus according to comparative example employing the ZnO layer 14 having the total oxygen concentration higher than the oxygen concentration in the area 4b of the ZnO layer 4 in the stacked photovoltaic apparatus according to Example 1 as the intermediate layer. More specifically, the normalized fill factor and the normalized conversion efficiency of Example 1 were 1.02 and 1.04 respectively.

It is conceivable from these results that the total conductivity of the ZnO layer 4 exceeded the conductivity of the ZnO layer 14 according to comparative example functioning as the intermediate layer, due to the area 4b, having the low oxygen concentration, around the surface of the ZnO layer 4 functioning as the intermediate layer. Thus, the stacked photovoltaic apparatus having the microcrystalline Si-based power generation unit 3 and the amorphous Si-based power generation unit 6 formed through the ZnO layer 4 was conceivably inhibited from increase of series resistance.

Referring to Table 5, it has been proved that the open-circuit voltage of the stacked photovoltaic apparatus according to Example 1 was slightly smaller than that of the stacked photovoltaic apparatus according to comparative example 1. More specifically, the normalized open-circuit voltage of Example 1 was 0.99.

According to Example 1, as hereinabove described, the SiO$_2$ film 5 having such a refractive index (1.5) that the difference between the same and the refractive index (3.5) of the n-type layer 61 is larger than the difference between the refractive index (2.0) of the ZnO layer 4 and the refractive index (3.5) of the n-type layer 61 is so formed between the ZnO layer 4 functioning as the intermediate layer and the n-type layer 61 of the amorphous Si-based power generation unit 6 that the reflectance on the interface between the SiO$_2$ film 5 and the n-type layer 61 layer of the amorphous Si-based power generation unit 6 is higher than that on the interface between the ZnO layer 4 and the n-type layer 61 holding no SiO2 film 5 therebetween with respect to light incident from the side of the amorphous Si-based power generation unit 6, whereby the quantity of light reflected toward the side of the amorphous Si-based power generation unit 6 can be increased as compared with the case of forming no SiO$_2$ film 5 between the ZnO layer 4 and the n-type layer 61. Thus, the quantity of light incident upon the photoelectric conversion layer 62 of the amorphous Si-based power generation unit 6 can be so increased as to increase the quantity of light photoelectrically converted in the photoelectric conversion layer 62 of the amorphous Si-based power generation unit 6. Consequently, the quantity of short-circuit current can be so increased as to improve the output characteristics of the stacked photovoltaic apparatus.

According to Example 1, the $SiO_2$ film 5 employed as an insulator layer has the thickness smaller than that of the ZnO layer 5, whereby the $SiO_2$ film 5 formed between the ZnO layer 4 and the n-type layer 61 of the amorphous Si-based power generation unit 6 with the small thickness can inhibit electric resistance between the ZnO layer 4 and the n-type layer 61 from disadvantageous increase.

According to Example 1, the ZnO layer 4 is employed as the intermediate layer while the oxygen concentration in the area 4b of the ZnO layer 4 around the surface thereof is rendered lower than that in the remaining area 4a of the ZnO layer 4, whereby the conductivity in the area 4b, having the low oxygen concentration, of the ZnO layer 4 around the surface thereof can be so increased as to increase the total conductivity of the ZnO layer 4. Thus, series resistance can be inhibited from increase in the stacked photovoltaic apparatus having the microcrystalline Si-based power generation unit 3 and the amorphous Si-based power generation unit 6 serially connected with each other through the ZnO layer 4. Consequently, the fill factor of the stacked photovoltaic apparatus can be so inhibited from reduction that the conversion efficiency can be improved.

EXAMPLE 2

Figure 5:
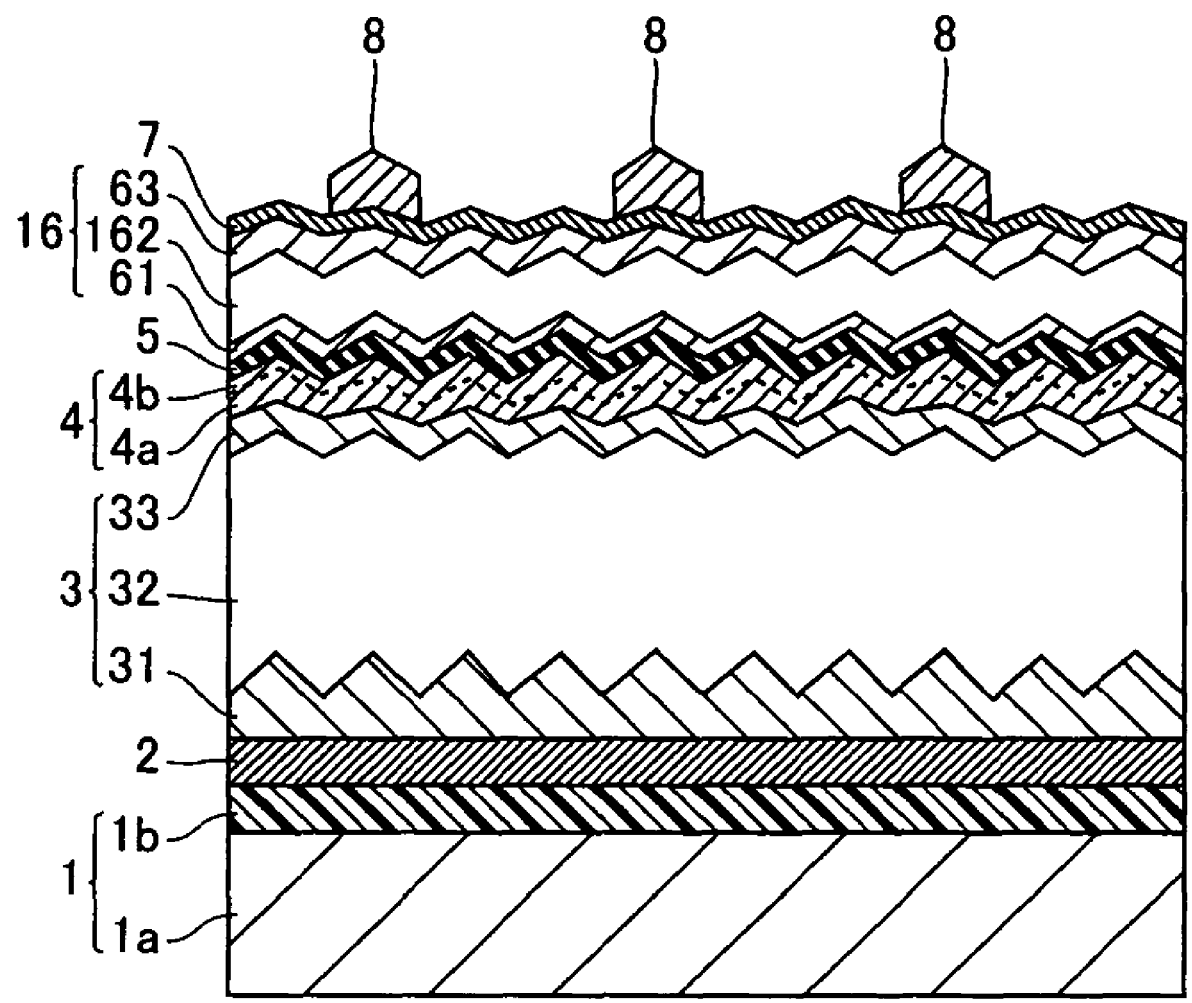
FIG. 5 is a sectional view showing the structure of a stacked photovoltaic apparatus prepared according to Example 2 of the present invention.

FIG. 5 is a sectional view showing the structure of a stacked photovoltaic apparatus according to Example 2 of the present invention. Referring to FIG. 5, a photoelectric conversion layer 162 of an amorphous Si-based power generation unit 16 in the stacked photovoltaic apparatus according to Example 2 has a thickness of 300 nm, which is smaller than the thickness (350 nm) of the photoelectric conversion layer 62 of the amorphous Si-based power generation unit 6 according to Example 1 shown in FIG. 1, in a structure similar to that of the stacked photovoltaic apparatus according to the aforementioned Example 1. The amorphous Si-based power generation unit 16 is an example of the "second power generation unit" in the present invention, and the photoelectric conversion layer 162 is an example of the "third semiconductor layer" in the present invention. The remaining structure of the stacked photovoltaic apparatus according to Example 2 is similar to that of the stacked photovoltaic apparatus according to Example 1. In other words, an $SiO_2$ film 5 having a refractive index of 1.5 is formed between a ZnO layer 4 having a refractive index of 2.0 and an n-type layer 61 of the amorphous Si-based power generation unit 16 having a refractive index of 3.5, similarly to the aforementioned Example 1. An area 4b of the ZnO layer 4 around the surface thereof has an oxygen concentration lower than that in the remaining area 4a of the ZnO layer 4.

[Preparation of Stacked Photovoltaic Apparatus]

The stacked photovoltaic apparatus according to Example 2 was prepared through a process similar to that employed for preparing the stacked photovoltaic apparatus according to the aforementioned Example 1. According to Example 2, however, the time for forming the photoelectric conversion layer 162 of the amorphous Si-based power generation unit 16 of amorphous Si was shorter than that for forming the photoelectric conversion layer 62 of the amorphous Si-based power generation unit 6 according to Example 1 shown in FIG. 1. Thus, the photoelectric conversion layer 162 of the amorphous Si-based power generation unit 16 was formed with the thickness (300 nm) smaller than the thickness (350 nm) of the photoelectric conversion layer 62 of the amorphous Si-based power generation unit 6 according to Example 1 shown in FIG. 1.

COMMON TO EXAMPLE 2 AND COMPARATIVE EXAMPLE

[Output Characteristic Experiment]

Then, rates of deterioration of the output characteristics of the stacked photovoltaic apparatus according to Example 2 prepared in the aforementioned manner and those of comparative example identical to that prepared for the aforementioned Example 1 were measured. In this output characteristic experiment, the initial characteristics (conversion efficiency, open-circuit voltage, short-circuit current and fill factor) of the stacked photovoltaic apparatuses according to Example 2 and comparative example were first measured under the following pseudo-sunlight photoirradiation conditions:

optical spectrum: AM 1.5
light intensity: 100 mW/cm$^2$
measuring temperature: 25° C.

Thereafter the stacked photovoltaic apparatuses according to Example 2 and comparative example were photo-deteriorated by applying light for 160 minutes under the following conditions with open terminals:

optical spectrum: AM 1.5
light intensity: 500 mW/cm$^2$
temperature: 25° C.

Then, the characteristics (conversion efficiency, open-circuit voltage, short-circuit current and fill factor) of the photo-deteriorated stacked photovoltaic apparatuses according to Example 2 and comparative example were measured again under the same conditions as the above. Table 6 shows results of this measurement. Referring to Table 6, the values of the normalized conversion efficiency, the normalized open-circuit voltage, the normalized short-circuit current and the normalized fill factor of the photo-deteriorated stacked photovoltaic apparatuses are normalized with reference to the initial characteristics of the normalized conversion efficiency, the normalized open-circuit voltage, the normalized short-circuit current and the normalized fill factor respectively.

TABLE 6

|  |  | Normalized Conversion Efficiency | Normalized Open-Circuit Voltage | Normalized Short-Circuit Current | Normalized Fill Factor |
| --- | --- | --- | --- | --- | --- |
| Example 2 | Initial Characteristics | 1.00 | 1.00 | 1.00 | 1.00 |
|  | Characteristics after Photo-Deterioration | 0.88 | 0.98 | 0.98 | 0.92 |

TABLE 6-continued

|  |  | Normalized Conversion Efficiency | Normalized Open-Circuit Voltage | Normalized Short-Circuit Current | Normalized Fill Factor |
|---|---|---|---|---|---|
| Comparative Example | Initial Characteristics | 1.00 | 1.00 | 1.00 | 1.00 |
|  | Characteristics after Photo-Deterioration | 0.81 | 0.97 | 0.98 | 0.85 |

Referring to Table 6, it has been proved that the stacked photovoltaic apparatus according to Example 2 prepared by setting the photoelectric conversion layer 162 of the amorphous Si-based power generation unit 16 consisting of amorphous Si to the thickness of 300 nm exhibited lower rates of reduction of the fill factor and the conversion efficiency as compared with the stacked photovoltaic apparatus according to comparative example prepared by setting the photoelectric conversion layer 62 of the amorphous Si-based power generation unit 6 of amorphous Si to the thickness of 350 nm. In other words, the stacked photovoltaic apparatus according to Example 2 was less photo-deteriorated as compared with the stacked photovoltaic apparatus according to comparative example. More specifically, the normalized fill factor and the normalized conversion efficiency of the photo-deteriorated stacked photovoltaic apparatus according to Example 2 were 0.92 and 0.88 respectively. On the other hand, the normalized fill factor and the normalized conversion efficiency of the photo-deteriorated stacked photovoltaic apparatus according to comparative example were 0.85 and 0.81 respectively.

It is conceivable from these results that the photoelectric conversion layer 162 of the amorphous Si-based power generation unit 16 consisting of amorphous Si, more easily photo-deteriorated than microcrystalline Si, was inhabitable from photo-deterioration due to the thickness (300 nm) smaller than the thickness (350 nm) of the photoelectric conversion layer 62 of the amorphous Si-based power generation unit 6 according to comparative example.

Referring to Table 6, it has been proved that the rate of reduction of the short-circuit current in the stacked photovoltaic apparatus according to Example 2 was identical to that in the stacked photovoltaic apparatus according to comparative example. More specifically, the normalized short-circuit current was 0.98 in each of the photo-deteriorated stacked photovoltaic apparatuses according to Example 2 and comparative example. It has also been proved that the rate of reduction of the open-circuit voltage in the stacked photovoltaic apparatus according to Example 2 was slightly smaller than that in the stacked photovoltaic apparatus according to comparative example. More specifically, the normalized open-circuit voltages of the photo-deteriorated stacked photovoltaic apparatuses according to Example 2 and comparative example were 0.98 and 0.97 respectively.

According to Example 2, as hereinabove described, the $SiO_2$ film 5 having such a refractive index (1.5) that the difference between the same and the refractive index (3.5) of the n-type layer 61 is larger than the difference between the refractive index (2.0) of the ZnO layer 4 and the refractive index (3.5) of the n-type layer 61 is so formed between the ZnO layer 4 functioning as the intermediate layer and the n-type layer 61 of the amorphous Si-based power generation unit 16 that the quantity of light reflected toward the side of the amorphous Si-based power generation unit 16 can be increased as compared with a case of forming no $SiO_2$ film 5 between the ZnO layer 4 and the n-type layer 61 similarly to the aforementioned Example 1, whereby the quantity of light incident upon the photoelectric conversion layer 162 of the amorphous Si-based power generation unit 16 can be increased. Therefore, the quantity of light photoelectrically converted in the photoelectric conversion layer 162 is not reduced due to a small optical path length in the photoelectric conversion layer 162 having a small thickness. Thus, the thickness of the photoelectric conversion layer 162, consisting of amorphous Si, of the amorphous Si-based power generation unit 16 can be so reduced as to suppress photo-deterioration of the photoelectric conversion layer 162 resulting from a large thickness. Consequently, the rate of photo-deterioration of the stacked photovoltaic apparatus including the amorphous Si-based power generation unit 16 employing the photoelectric conversion layer 162 consisting of amorphous Si can be inhibited from increase.

The remaining effects of Example 2 are similar to those of the aforementioned Example 1.

Although the present invention has been described and illustrated in detail, it is clearly understood that the same is by way of illustration and example only and is not to be taken by way of limitation, the spirit and scope of the present invention being limited only by the terms of the appended claims.

For example, while the $SiO_2$ film having the refractive index of 1.5 was employed as the reflection promotive layer formed between the ZnO layer (refractive index: 2.0) functioning as the intermediate layer and the n-type layer (refractive index: 3.5) of the amorphous Si-based power generation unit in each of the aforementioned Examples 1 and 2, the present invention is not restricted to this but an insulator layer other than the $SiO_2$ film or a conductive layer may alternatively be employed so far as the same has such a refractive index that the difference between this refractive index and the refractive index (3.5) of the n-type layer is larger than the difference between the refractive index (2.0) of the ZnO layer and the refractive index (3.5) of the n-type layer.

While the ZnO layer doped with Al was employed as the intermediate layer formed between the microcrystalline Si-based power generation unit and the amorphous Si-based power generation unit in each of the aforementioned Examples 1 and 2, the present invention is not restricted to this but a conductive layer other than the ZnO layer doped with Al may alternatively be employed as the intermediate layer. For example, a ZnO layer doped with Ga or B is conceivable as the conductive layer other than the ZnO layer doped with Al. As another conductive layer other than the ZnO layer, a transparent conductive layer such as an ITO layer (refractive index: 2.1 to 2.2), an IZO (indium zinc oxide) layer (refractive index: 2.0) or a CTO ($Cd_2SnO_4$) layer is also conceivable. When a metal oxide layer is employed as the intermediate layer, the oxygen concentration in a prescribed area of this metal oxide layer is preferably lower than that in the remaining area.

While the thickness of the SiO$_2$ film formed between the intermediate layer and the amorphous Si-based power generation unit was set to 10 nm in each of the aforementioned Examples 1 and 2, the present invention is not restricted to this but the thickness of the SiO$_2$ film may simply be not more than 100 nm.

While the present invention has been applied to the stacked photovoltaic apparatus having the microcrystalline Si-based power generation unit and the amorphous Si-based power generation unit successively stacked on the substrate in each of the aforementioned Examples 1 and 2, the present invention is not restricted to this but the amorphous Si-based power generation unit may alternatively be formed on the side closer to the substrate. If the amorphous Si-based power generation unit is on the light incidence side, at least three power generation units may be stacked on the substrate.

While the microcrystalline Si layers were employed as the semiconductor layers arranged on both sides of the photoelectric conversion layer in the stacking direction in each of the aforementioned Examples 1 and 2, the present invention is not restricted to this but amorphous Si layers may alternatively be arranged on both sides of the photoelectric conversion layer in the stacking direction. Further alternatively, an amorphous Si layer and a microcrystalline Si layer may be arranged on the first and second sides of the photoelectric conversion layer respectively.

While the substrate having the resin layer of polyimide resin formed on the stainless steel sheet was employed in each of the aforementioned Examples 1 and 2, the present invention is not restricted to this but a sheet of a metal such as iron, molybdenum or aluminum or an alloy material thereof may alternatively be employed in place of the stainless steel sheet. Further, an insulating material such as polyether sulfone (PES) resin or SiO$_2$ may be employed in place of polyimide resin. The aforementioned metal(s) and the aforementioned insulating material may be arbitrarily combined with each other.

While the substrate having the planar surface prepared by forming the resin layer on the planar stainless steel sheet was employed in each of the aforementioned Examples 1 and 2, the present invention is not restricted to this but the surface of the substrate may alternatively be corrugated by mixing particles of SiO$_2$ or TiO$_2$ having diameters of several 100 µm into the resin layer formed on the stainless steel sheet. In this case, the surface of the back electrode formed on the substrate is corrugated by reflecting the corrugated surface of the substrate, whereby incident light can be scattered through the corrugated surface of the back electrode. Thus, an excellent light confinement effect can be attained.

While the microcrystalline Si-based power generation unit and the amorphous Si-based power generation unit were successively stacked on the substrate transmitting no light in each of the aforementioned Examples 1 and 2, the present invention is not restricted to this but the microcrystalline Si-based power generation unit and the amorphous Si-based power generation unit may alternatively be successively stacked on a substrate of glass or the like transmitting light, so that the light is incident from the side of the substrate.

What is claimed is:

1. A stacked photovoltaic apparatus comprising:
   a first power generation unit including a first semiconductor layer functioning as a photoelectric conversion layer;
   a second power generation unit including a first conductive type second semiconductor layer formed on said first power generation unit and having a first refractive index, a third semiconductor layer of a substantially intrinsic amorphous semiconductor formed on said second semiconductor layer for functioning as another photoelectric conversion layer, and a second conductive type fourth semiconductor layer formed on said third semiconductor layer;
   an intermediate layer formed between said first power generation unit and said second power generation unit and having a second refractive index; and
   a reflection promotive layer formed between said intermediate layer and said second semiconductor layer of said second power generation unit and having a third refractive index such that the difference between said third refractive index and said first refractive index of said second semiconductor layer is larger than the difference between said second refractive index of said intermediate layer and said first refractive index of said second semiconductor layer, and wherein said reflection promotive layer is formed so as to cover all of a surface of said intermediate layer; wherein
   said intermediate layer includes a metal oxide layer, and
   said metal oxide layer constituting said intermediate layer includes a first portion having a first oxygen concentration and a second portion, positioned closer to said reflection promotive layer, having a second oxygen concentration lower than said first oxygen concentration of said first portion.

2. The stacked photovoltaic apparatus according to claim 1, wherein
   said second refractive index of said intermediate layer is smaller than said first refractive index of said second semiconductor layer, and said third refractive index of said reflection promotive layer is smaller than said second refractive index of said intermediate layer.

3. The stacked photovoltaic apparatus according to claim 1, wherein
   said intermediate layer is formed by a conductive layer, and
   said reflection promotive layer is formed by an insulator layer with a smaller thickness than said intermediate layer.

4. The stacked photovoltaic apparatus according to claim 1, wherein
   said reflection promotive layer includes an oxygen-containing layer, and is formed on said second portion of said metal oxide layer constituting said intermediate layer.

5. The stacked photovoltaic apparatus according to claim 1, wherein
   said reflection promotive layer consists of an oxide of an element constituting said second semiconductor layer of said second power generation unit.

6. The stacked photovoltaic apparatus according to claim 5, wherein
   said element constituting said second semiconductor layer of said second power generation unit is Si.

7. The stacked photovoltaic apparatus according to claim 1, wherein
   said second semiconductor layer includes an Si layer,
   said intermediate layer includes a ZnO layer, and
   said reflection promotive layer includes an SiO2 layer.

8. The stacked photovoltaic apparatus according to claim 1, wherein
   said first semiconductor layer of said first power generation unit functioning as said photoelectric conversion layer includes a microcrystalline semiconductor layer, and
   said second power generation unit including said third semiconductor layer of said amorphous semiconductor functioning as said photoelectric conversion layer is arranged on a light incidence side.

9. The stacked photovoltaic apparatus according to claim 1, wherein
said third semiconductor layer of said second power generation unit functioning as said photoelectric conversion layer photoelectrically converts light incident from the side of said second power generation unit and light reflected toward the side of said third semiconductor layer on the interface between said second semiconductor layer of said second power generation unit and said reflection promotive layer.

10. The stacked photovoltaic apparatus according to claim 9, wherein
said photoelectric conversion layer of said first power generation unit photoelectrically converts light incident from the side of said second power generation unit and transmitted through said reflection promotive layer.

11. The stacked photovoltaic apparatus according to claim 1, wherein
said reflection promotive layer has a corrugated surface.

12. The stacked photovoltaic apparatus according to claim 11, wherein
said second semiconductor layer of said second power generation unit is formed on said corrugated surface of said reflection promotive layer.

13. The stacked photovoltaic apparatus according to claim 1, wherein
said photoelectric conversion layer of at least either said first power generation unit or said second power generation unit has a corrugated surface.

14. The stacked photovoltaic apparatus according to claim 1, further comprising a substrate transmitting no light, wherein
said first power generation unit, said intermediate layer, said reflection promotive layer and said second power generation unit are successively stacked on said substrate.

* * * * *